United States Patent
Choi et al.

(10) Patent No.: US 11,254,871 B2
(45) Date of Patent: Feb. 22, 2022

(54) ETCHING COMPOSITION FOR SILICON NITRIDE LAYER AND METHOD OF ETCHING SILICON NITRIDE LAYER USING THE SAME

(71) Applicant: SAMSUNG SDI CO., LTD., Yongin-si (KR)

(72) Inventors: Jung Min Choi, Suwon-si (KR); Jun Young Jang, Suwon-si (KR); Hyun Jung Kim, Suwon-si (KR); Hyung Rang Moon, Suwon-si (KR); Ji Hye Lee, Suwon-si (KR); Kwen Woo Han, Suwon-si (KR); Ki Wook Hwang, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 17/071,224

(22) Filed: Oct. 15, 2020

(65) Prior Publication Data

US 2021/0115335 A1 Apr. 22, 2021

(30) Foreign Application Priority Data

Oct. 18, 2019 (KR) .................. 10-2019-0130273

(51) Int. Cl.

| | |
|---|---|
| *C09K 13/06* | (2006.01) |
| *H01L 21/02* | (2006.01) |
| *H01L 21/311* | (2006.01) |
| *H01L 21/306* | (2006.01) |
| *C09G 1/06* | (2006.01) |
| *C09K 3/14* | (2006.01) |
| *C09G 1/04* | (2006.01) |
| *C09G 1/00* | (2006.01) |
| *C09G 1/02* | (2006.01) |

(52) U.S. Cl.
CPC ................ *C09K 13/06* (2013.01); *C09G 1/00* (2013.01); *C09G 1/02* (2013.01); *C09G 1/04* (2013.01); *C09G 1/06* (2013.01); *C09K 3/1454* (2013.01); *C09K 3/1463* (2013.01); *H01L 21/0217* (2013.01); *H01L 21/02019* (2013.01); *H01L 21/30604* (2013.01); *H01L 21/31111* (2013.01)

(58) Field of Classification Search
None
See application file for complete search history.

(56) References Cited

U.S. PATENT DOCUMENTS

| 4,092,211 A | 5/1978 | Morris | |
|---|---|---|---|
| 2017/0175053 A1* | 6/2017 | Yokota | ..................... C11D 7/28 |
| 2017/0260632 A1 | 9/2017 | Kodera et al. | |
| 2019/0074188 A1 | 3/2019 | Cooper et al. | |
| 2019/0085208 A1 | 3/2019 | Shinoda et al. | |

FOREIGN PATENT DOCUMENTS

| CN | 104073803 A | 10/2014 |
|---|---|---|
| CN | 109097774 A | 12/2018 |
| KR | 10-2015-0089887 A | 8/2015 |
| TW | 201402866 A | 1/2014 |

OTHER PUBLICATIONS

Chinese Office action dated Jun. 28, 2021.

* cited by examiner

*Primary Examiner* — Jiong-Ping Lu
(74) *Attorney, Agent, or Firm* — Lee IP Law, P.C.

(57) ABSTRACT

An etching composition for silicon nitride layers and a method of etching a silicon nitride layer using the composition, the etching composition including an inorganic acid or a salt thereof; a solvent; an acid-modified silica or an acid-modified silicic acid; and a cyclic compound containing four or more nitrogen atoms.

12 Claims, No Drawings

ETCHING COMPOSITION FOR SILICON NITRIDE LAYER AND METHOD OF ETCHING SILICON NITRIDE LAYER USING THE SAME

CROSS-REFERENCE TO RELATED APPLICATION

Korean Patent Application No. 10-2019-0130273, filed on Oct. 18, 2019, in the Korean Intellectual Property Office, and entitled: "Etching Composition for Silicon Nitride Layer and Method of Etching Silicon Nitride Layer Using the Same," is incorporated by reference herein in its entirety.

BACKGROUND

1. Field

Embodiments relate to an etching composition for a silicon nitride layer and a method of etching a silicon nitride layer using the same.

2. Description of the Related Art

In a semiconductor manufacturing process, a silicon nitride layer may be present on an upper or lower surface of a silicon oxide layer, or the silicon nitride layer and the silicon oxide layer may be alternately stacked one above another.

An etching method may use a phosphoric acid solution heated to high temperature to remove a silicon nitride layer pattern formed on a substrate during a semiconductor manufacturing process. The phosphoric acid solution may have a limitation in increasing silicon nitride layer-to-silicon oxide layer etching selectivity. Addition of a silane compound to the phosphoric acid solution may be considered to increase the etching selectivity.

SUMMARY

The embodiments may be realized by providing an etching composition for a silicon nitride layer, the etching composition including an inorganic acid or a salt thereof; a solvent; an acid-modified silica or an acid-modified silicic acid; and a cyclic compound containing four or more nitrogen atoms.

The cyclic compound containing four or more nitrogen atoms may include a substituted or unsubstituted tetrazole or a substituted or unsubstituted tetrazine.

The cyclic compound containing four or more nitrogen atoms may include the substituted or unsubstituted tetrazole, the substituted or unsubstituted tetrazole may include a compound represented by Formula 1:

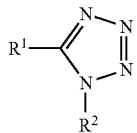

in Formula 1, $R^1$ and $R^2$ may be each independently hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

The cyclic compound containing four or more nitrogen atoms may include the substituted or unsubstituted tetrazole, the substituted or unsubstituted tetrazole may include an aminotetrazole, an alkyltetrazole, or an aminoalkyltetrazole.

The inorganic acid may include phosphoric acid.

The etching composition may include about 60 wt % to about 95 wt % of the inorganic acid or the salt thereof; about 0.0001 wt % to about 10 wt % of the acid-modified silica or the acid-modified silicic acid; about 0.0000001 wt % to about 10 wt % of the cyclic compound containing four or more nitrogen atoms; and the solvent, all wt % being based on a total weight of the etching composition.

The embodiments may be realized by providing a method of etching a silicon nitride layer, the method including etching a silicon nitride layer using the etching composition for a silicon nitride layer according to an embodiment.

The cyclic compound containing four or more nitrogen atoms may include a substituted or unsubstituted tetrazole or a substituted or unsubstituted tetrazine.

The cyclic compound containing four or more nitrogen atoms may include the substituted or unsubstituted tetrazole, the substituted or unsubstituted tetrazole may include a compound represented by Formula 1:

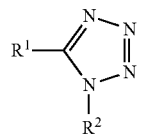

in Formula 1, $R^1$ and $R^2$ may be each independently hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

The cyclic compound containing four or more nitrogen atoms may include the substituted or unsubstituted tetrazole, the substituted or unsubstituted tetrazole may include an aminotetrazole, an alkyltetrazole, or an aminoalkyltetrazole.

The inorganic acid may include phosphoric acid.

The etching composition may include about 60 wt % to about 95 wt % of the inorganic acid or the salt thereof; about 0.0001 wt % to about 10 wt % of the acid-modified silica or the acid-modified silicic acid; about 0.0000001 wt % to about 10 wt % of the cyclic compound containing four or more nitrogen atoms; and the solvent, all wt % being based on a total weight of the etching composition.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

Herein, the disclosure of a numerical range indicated by two values for a given parameter (for example, a $C_1$ to $C_{10}$ alkyl group) may be interpreted as disclosing that any value between the two values and any sub-range of the range could also be employed for the given parameter.

For example, "$C_1$ to $C_{10}$ alkyl group" may include a $C_1$ alkyl group, a $C_2$ alkyl group, a $C_3$ alkyl group, a $C_4$ alkyl group, a $C_5$ alkyl group, . . . , a $C_8$ alkyl group, a $C_9$ alkyl group, a $C_{10}$ alkyl group, a $C_1$ to $C_6$ alkyl group, a $C_1$ to $C_5$ alkyl group, or the like. As used herein, the term "or" is not an exclusive term, e.g., "A or B" would include A, B, or A and B.

As used herein, the term "alkyl" means a saturated straight or branched carbon chain having an indicated number of carbon atoms.

As used herein, the term "aryl" means an aromatic carbon ring having an indicated number of carbon atoms. An aryl group may be monocyclic or polycyclic (for example, bicyclic or tricyclic).

As used herein, the term "arylalkyl" means a residue having an indicated number of carbon atoms, wherein an aryl moiety is attached to a parent structure via an alkyl residue. Here, the alkyl residue may be straight or branched.

As used herein "halogen" means F, Cl, Br or I.

As used herein, the term "substituted" in the term "substituted or unsubstituted" means that at least one hydrogen atom in a corresponding functional group is substituted with one selected from the group of a halogen, a hydroxyl group, a thiol group, a cyano group, an amino group, a carboxylic acid group, a sulfonic acid group, a phosphoric acid group, a phosphonic acid group, an azole group, *—C(=O)(R4), *—C(=O)—N(R4)(R5), *—C(=O)—OC(=O)(R4) (where R4 and R5 are each independently hydrogen, a $C_1$ to $C_{10}$ alkyl group, a $C_3$ to $C_{10}$ cycloalkyl group, or a $C_6$ to $C_{20}$ aryl group), a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group.

According to an embodiment, addition of both a cyclic nitrogen compound containing four or more nitrogen atoms and one of acid-modified silica or acid-modified silicic acid to an etching composition for silicon nitride layers including an inorganic acid or a salt thereof and a solvent may help significantly increase silicon nitride layer-to-silicon oxide layer etching selectivity in etching at high temperature and may eliminate the need for high-temperature storage and transportation by allowing the etching composition to retain high silicon nitride layer-to-silicon oxide layer etching selectivity even when used in etching at high temperature after storage at room or ambient temperature.

Hereinafter, each component of an etching composition for silicon nitride layers according to an embodiment will be described in detail.

The inorganic acid or the salt thereof may promote etching by providing hydrogen ions to the etching composition for silicon nitride layers. In an implementation, the inorganic acid may include sulfuric acid, nitric acid, hydrochloric acid, perchloric acid, hydrofluoric acid, boric acid, phosphoric acid ($H_3PO_4$), phosphorous acid ($H_3PO_3$), hypophosphorous acid ($H_3PO_2$), hypophosphoric acid ($H_4P_2O_6$), tripolyphosphoric acid ($H_5P_3O_{10}$), or pyrophosphoric acid ($H_4P_2O_7$). In an implementation, the inorganic acid may be phosphoric acid.

The inorganic acid or the salt thereof may be present in an amount of about 60 wt % to about 95 wt % in the etching composition for silicon nitride layers (e.g., based on a total weight of the composition). Within this range, the etching composition may have an increased ratio of an etching rate of a silicon nitride layer to an etching rate of a silicon oxide layer (silicon nitride layer-to-silicon oxide layer etching selectivity). In an implementation, the inorganic acid or the salt thereof may be present in an amount of about 60 wt % to about 90 wt % (e.g., 60 wt %, 70 wt %, 80 wt %, or 90 wt %) or about 80 wt % to about 90 wt % in the etching composition for silicon nitride layers.

The solvent may be. e.g., water. In an implementation, semiconductor grade water or ultrapure water may be used. In an implementation, the solvent may be present in a balance amount in the etching composition for silicon nitride layers.

The etching composition may include an acid-modified silica or an acid-modified silicic acid. The acid-modified silica or the acid-modified silicic acid may contain Si—OH at least on a surface thereof, and thus may help protect the silicon oxide layer upon etching the silicon nitride layer.

With the acid-modified silica or the acid-modified silicic acid, which may be used instead of a silane compound or a silicon compound, the etching composition according to an embodiment may help provide protection of the silicon oxide layer at a high temperature, e.g., at a temperature of about 200° C. to about 300° C. or about 230° C. to about 300° C. Other etching compositions, which may include a silane compound or a silicon compound, may be less effective in protecting the silicon oxide layer during etching at a high temperature and thus may not be useful in etching at high temperature.

The acid-modified silica or the acid-modified silicic acid may have a structure in which silica or silicic acid is at least partially surface-modified with OH groups. In an implementation, about 10% to about 100% of the surface of silica or silicic acid may be modified with OH groups.

The acid-modified silica or the acid-modified silicic acid may be present in an amount of about 0.0001 wt % to about 10 wt % (e.g., 0.0001 wt %, 0.001 wt %, 0.01 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, or 10 wt %), or about 0.1 wt % to about 5 wt %, in the etching composition. Within this range, the etching composition can have increased silicon nitride layer-to-silicon oxide layer etching selectivity.

The acid-modified silica may be prepared by adding silica to an anhydride of an acid or an aqueous solution of an acid, followed by modification reaction at a high temperature. In an implementation, the acid may include one of the aforementioned inorganic acids. In an implementation, the acid may be phosphoric acid.

The silica may be modified with the acid, e.g., with an aqueous solution of the acid. The aqueous solution of the acid may have an acid concentration of about 1 wt % to about 85 wt %, e.g., about 10 wt % to 85 wt %. Within this range, the aqueous solution may be further effective in modification of the silica. A reaction of modifying the silica with the acid may be performed at a high temperature, whereby the acid-modified silica can have Si—OH groups on the surface thereof. In an implementation, the modification reaction may be performed at a temperature of about 100° C. to about 300° C., or about 150° C. to about 250° C. Within this range, surface-modification of the silica may be achieved more efficiently.

In an implementation, the modification reaction may be performed for about 10 to 120 minutes, e.g., about 30 to 90 minutes, after adding the silica to the anhydride of the acid or the aqueous solution of the acid. Within this range, surface-modification of silica may be achieved more efficiently.

In an implementation, in the modification reaction, the silica may be present in an amount of about 0.001 parts by weight to about 10 parts by weight, e.g., about 0.1 parts by weight to about 5 parts by weight, relative to 100 parts by weight of the anhydride of the acid or the aqueous solution of the acid. Within this range, silicon nitride layer-to-silicon oxide layer etching selectivity may be be improved through modification of the silica, sufficient dissolution and modification of the silica may be achieved due to use of a proper amount of the silica, and precipitation of the silica after preparation of the acid-modified silica may be prevented.

The acid-modified silicic acid may be prepared in the same or substantially the same manner as in preparation of the acid-modified silica.

The acid-modified silica or the acid-modified silicic acid may help suppress etching of the silicon oxide layer by protecting the silicon oxide layer at a high temperature of about 200° C. or more. In an implementation, when cooled from high temperature to ambient temperature, the acid-modified silica or the acid-modified silicic acid could return to a pre-modification state, or particles thereof could be combined together, causing deterioration in stability in the etching composition. As a result, an etching composition could have poor silicon nitride layer-to-silicon oxide layer etching selectivity when used at a high temperature again. The etching composition according to an embodiment may further include the cyclic compound containing four or more nitrogen atoms, in addition to the acid-modified silica or the acid-modified silicic acid.

The cyclic compound containing four or more nitrogen atoms may help improve stability of the acid-modified silica or the acid-modified silicic acid such that the acid-modified silica or the acid-modified silicic acid may be prevented from returning to the pre-modification state, thereby allowing the etching composition to retain high silicon nitride layer-to-silicon oxide layer etching selectivity when used in etching at high temperature, regardless of change in temperature of the etching composition. In an implementation, use of the cyclic compound containing four or more nitrogen atoms may eliminate the need for additional equipment and costs for maintaining the etching composition at high temperature during storage and transportation. In addition, the cyclic compound containing four or more nitrogen atoms may help reduce a rate at which the acid-modified silica or the acid-modified silicic acid precipitates into silica or silicic acid by improving stability of the acid-modified silica or the acid-modified silicic acid.

The cyclic compound containing four or more nitrogen atoms may include a compound having 4 or more, e.g., 4 to 8 nitrogen atoms, in a ring structure. Herein, the "ring structure" may include not only a monocyclic structure having nitrogen and carbon, but also a polycyclic structure. Here, the "polycyclic structure" may include a structure in which two or more monocyclic structures having nitrogen and/or carbon are fused while sharing carbon or nitrogen with one another.

In an implementation, the cyclic compound containing four or more nitrogen atoms may include, e.g., a substituted or unsubstituted tetrazole, a substituted or unsubstituted tetrazine, a substituted or unsubstituted purine, a substituted or unsubstituted adenine, a substituted or unsubstituted guanine, or a substituted or unsubstituted xanthine. In an implementation, the cyclic compound containing four or more nitrogen atoms may include a substituted or unsubstituted tetrazole or a substituted or unsubstituted tetrazine, e.g., a substituted or unsubstituted tetrazole.

In an implementation, the substituted or unsubstituted tetrazole may include a compound represented by Formula 1.

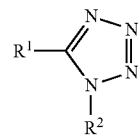

[Formula 1]

In Formula 1, $R^1$ and $R^2$ may each independently be or include, e.g., hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

In an implementation, in Formula 1, $R^1$ and $R^2$ may each independently be or include, e.g., hydrogen, an amino group, or an unsubstituted $C_1$ to $C_5$ alkyl group. In an implementation, $R^1$ may be, e.g., an amino group or a $C_1$ to $C_5$ alkyl group. In an implementation, $R^2$ may be hydrogen.

In an implementation, the substituted or unsubstituted tetrazole may include, e.g., an aminotetrazole such as 5-aminotetrazole, an alkyltetrazole including a methyltetrazole such as 5-methyltetrazole, or an aminoalkyltetrazole including an aminomethyltetrazole such as 5-amino-1-methyltetrazole.

In an implementation, the substituted or unsubstituted tetrazine may include, e.g., a compound represented by Formula 2 or a compound represented by Formula 3.

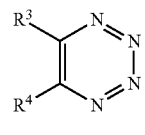

[Formula 2]

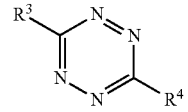

[Formula 3]

In Formulae 2 and 3, $R^3$ and $R^4$ may each independently be or include, e.g., hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

In an implementation, in Formulae 2 and 3, $R^3$ and $R^4$ may each independently be or include, e.g., hydrogen, an unsubstituted $C_1$ to $C_5$ alkyl group, or an unsubstituted $C_6$ to $C_{10}$ aryl group.

In an implementation, the compound represented by Formula 2 or the compound represented by Formula 3 may include, e.g., 1,2,4,5-tetrazine or 1,2,3,4-tetrazine.

The cyclic compound containing four or more nitrogen atoms may be present in an amount of about 0.0000001 wt % to 10 wt % (e.g., 0.0000001 wt %, 0.000001 wt %, 0.00001 wt %, 0.0001 wt %, 0.001 wt %, 0.01 wt %, 0.1 wt %, 1 wt %, 2 wt %, 3 wt %, 4 wt %, 5 wt %, 6 wt %, 7 wt %, 8 wt %, 9 wt %, or 10 wt %), or about 0.1 wt % to about 10 wt % in the etching composition. Within this range, improvement in silicon nitride layer-to-silicon oxide layer etching selectivity may be achieved through silica modification.

The etching composition for silicon nitride layers may further include a suitable additive to help improve etching performance. In an implementation, the etching composition may further include, e.g., a surfactant, a dispersant, or an etching rate modifier.

A method of etching a silicon nitride layer according to an embodiment may include etching a silicon nitride layer using the etching composition for silicon nitride layers described above.

The etching method may include, e.g.: forming a silicon nitride layer or a silicon oxide layer on a substrate; performing etching by applying the etching composition for silicon nitride layers to the silicon nitride layer or the silicon oxide layer; and removing the etching composition for silicon nitride layers after performing etching.

The substrate may include a suitable substrate, e.g., a semiconductor wafer.

Performing etching by applying the etching composition for silicon nitride layers to the silicon nitride layer or the silicon oxide layer may include, e.g., immersing the silicon nitride layer or the silicon oxide layer in an etching bath containing the etching composition for silicon nitride layers or spraying the etching composition for silicon nitride layers onto the silicon nitride layer or the silicon oxide layer.

The etching method may further include heating the etching composition for silicon nitride layers before performing etching by applying the etching composition for silicon nitride layers to the silicon nitride layer or the silicon oxide layer. In an implementation, the etching composition for silicon nitride layers may be heated to a temperature of about 200° C. or more, e.g., to a temperature of about 200° C. to about 300° C. In an implementation, the etching composition for silicon nitride layers may be heated to a temperature of about 230° C. to about 300° C.

Removing the etching composition for silicon nitride layers after performing etching may include, e.g., washing the etching composition with ultrapure water, followed by drying the silicon oxide layer or the silicon nitride layer.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

Silica (QS-30, Tokuyama Corporation, primary particle size: 7 nm) was added to an aqueous solution of phosphoric acid (concentration: 85 wt %). The silica was present in an amount of 1 part by weight relative to 100 parts by weight of the aqueous solution of phosphoric acid. Then, a reaction therebetween was conducted at 150° C. for 60 minutes, followed by filtration, thereby preparing acid-modified silica.

Then, 85 wt % of phosphoric acid, 0.5 wt % of the prepared acid-modified silica, 0.5 wt % of 5-methyltetrazole, and a balance of water were mixed, thereby preparing an etching composition for silicon nitride layers.

Example 2

Silicic acid (Sigma-Aldrich Co. LLC.) was added to an aqueous solution of phosphoric acid (concentration: 85 wt %). The silicic acid was present in an amount of 2 parts by weight relative to 100 parts by weight of the aqueous solution of phosphoric acid. Then, a reaction therebetween was conducted at 150° C. for 60 minutes, followed by filtration, thereby preparing acid-modified silicic acid.

An etching composition for silicon nitride layers was prepared in the same manner as in Example 1 using the prepared acid-modified silicic acid.

Examples 3 to 4

Etching compositions for silicon nitride layers were prepared in the same manner as in Example 1 except that the amount of 5-methyltetrazole was changed as shown in Table 1.

Examples 5 to 7

Etching compositions for silicon nitride layers were prepared in the same manner as in Example 1 except that 5-aminotetrazole was used in amounts shown in Table 1 instead of 0.5 wt % of 5-methyltetrazole.

Example 8

An etching composition for silicon nitride layers was prepared in the same manner as in Example 1 except that tetrazole was used in an amount shown in Table 1 instead of 0.5 wt % of 5-methyltetrazole.

Comparative Example 1

An etching composition for silicon nitride layers was prepared in the same manner as in Example 1 except that 5-methyltetrazole was not included.

Comparative Example 2

An etching composition for silicon nitride layers was prepared in the same manner as in Example 1 except that 1 wt % of triazole was used instead of 0.5 wt % of 5-methyltetrazole.

Comparative Example 3

An etching composition for silicon nitride layers was prepared in the same manner as in Example 1 except that 1 wt % of pyrazole was used instead of 0.5 wt % of 5-methyltetrazole.

Comparative Example 4

An etching composition for silicon nitride layers was prepared in the same manner as in Example 1 except that 1 wt % of monobasic ammonium phosphate was used instead of 0.5 wt % of 5-methyltetrazole.

Each of the etching compositions for silicon nitride layers prepared in the Examples (E) and Comparative Examples (CE) was evaluated as to properties listed in Table 1.

After each of the etching compositions for silicon nitride layers prepared in the Examples and Comparative Examples was heated to 230° C., an LP-SiN film or a PE-SiO film was placed in the etching composition, followed by etching for 5 minutes. After measuring pre-etching and post-etching thicknesses of the LP-SiN film or the PE-SiO film using an ellipsometer, an etching rate (A) of the silicon nitride layer and an etching rate (B) of the silicon oxide layer were calculated, followed by calculating an etching selectivity ratio according to Equation 1. Results are shown in Table 1 and are referred to as "initial selectivity ratio".

[Equation 1]

Etching selectivity=$A/B$,   (1)

A is an etching rate of the silicon nitride layer per unit time (unit: Å/min), and B is an etching rate of the silicon oxide layer per unit time (unit: Å/min).

Each of the etching compositions for silicon nitride layers prepared in Examples and Comparative Examples was stored at 25° C. for 24 hours and then heated to 230° C., followed by calculation of the etching rates and the etching selectivity ratio in the same manner as above. Results are shown in Table 1 and are referred to as "post-storage selectivity ratio".

Presence/absence of by-products was evaluated by turbidity measurement.

such a high-temperature etching process may cause poor stability. Accordingly, the use of acid-modified silica or acid-modified silicic acid instead of a silane compound may be considered in order to increase the etching selectivity. The acid-modified silica or the acid-modified silicic acid may not return to a pre-modification state at high temperature and may help increase etching selectivity through adsorption to a silicon oxide layer. When cooled to ambient temperature, the acid-modified silica or the acid-modified silicic acid may exhibit poor stability or may return to the pre-modification state since particles thereof are combined together. Accordingly, the use of the cooled acid-modified silica or the cooled acid-modified silicic acid in etching at high temperature may not ensure increase in etching selectivity. Maintaining the acid-modified silica or the acid-modified silicic acid at high temperature during storage or transportation may require additional equipment and costs for maintaining high temperatures.

TABLE 1

| | I (wt %) | II (wt %) | Compound Kind | Amount (wt %) | (Initial) Etching rate (Å/min) Silicon nitride layer | (Initial) Etching rate (Å/min) Silicon oxide layer | (Initial) Selectivity ratio | (Post-storage) Etching rate (Å/min) Silicon nitride layer | (Post-storage) Etching rate (Å/min) Silicon oxide layer | (Post-storage) Selectivity ratio | By-products |
|---|---|---|---|---|---|---|---|---|---|---|---|
| E 1 | 0.5 | 0 | 5-methyltetrazole | 0.5 | 505 | 0.3 | 1683 | 503 | 0.3 | 1677 | Absent |
| E 2 | 0 | 0.5 | 5-methyltetrazole | 0.5 | 517 | 0.1 | 5170 | 520 | 0.2 | 2600 | Absent |
| E 3 | 0.5 | 0 | 5-methyltetrazole | 1 | 495 | 0.5 | 990 | 494 | 0.5 | 988 | Absent |
| E 4 | 0.5 | 0 | 5-methyltetrazole | 5 | 490 | 0.8 | 613 | 492 | 0.7 | 703 | Absent |
| E 5 | 0.5 | 0 | 5-aminotetrazole | 0.5 | 498 | 0.4 | 1245 | 499 | 0.4 | 1248 | Absent |
| E 6 | 0.5 | 0 | 5-aminotetrazole | 1 | 480 | 0.7 | 686 | 477 | 0.6 | 795 | Absent |
| E 7 | 0.5 | 0 | 5-aminotetrazole | 5 | 474 | 1 | 474 | 476 | 0.9 | 529 | Absent |
| E 8 | 0.5 | 0 | Tetrazole | 1 | 512 | 0.4 | 1280 | 513 | 0.3 | 1710 | Absent |
| CE 1 | 0.5 | 0 | — | — | 515 | 0.2 | 2575 | 502 | 12 | 42 | Present |
| CE 2 | 0.5 | 0 | Triazole | 1 | 503 | 0.3 | 1677 | 499 | 11 | 45 | Present |
| CE 3 | 0.5 | 0 | Pyrazole | 1 | 507 | 0.2 | 2535 | 503 | 14 | 36 | Present |
| CE 4 | 0.5 | 0 | Monobasic ammonium phosphate | 1 | 514 | 0.4 | 1285 | 508 | 15 | 34 | Present |

* In Table 1, I is acid-modified silica and II is acid-modified silicic acid.

As shown in Table 1, the etching composition for silicon nitride layers according to the Examples had increased silicon nitride layer-to-silicon oxide layer etching selectivity at high temperature and could retain high silicon nitride layer-to-silicon oxide layer etching selectivity when used in etching at high temperature after storage at ambient temperature.

Conversely, the etching composition of Comparative Example 1 (free from the cyclic compound containing four or more nitrogen atoms), the etching composition of Comparative Example 2 (including a cyclic compound containing only three nitrogen atoms), and the etching composition of Comparative Example 3 (including a cyclic compound containing only two nitrogen atoms) had a problem of precipitation of by-products. In addition, the etching composition of Comparative Example 4 (including an ammonium compound) also had a problem of precipitation of by-products.

By way of summation and review, etching a silicon nitride layer and a silicon oxide layer may occur at a high temperature of 200° C. or more. Use of a silane compound in One or more embodiments may provide an etching composition for silicon nitride layers, which can significantly increase silicon nitride layer-to-silicon oxide layer etching selectivity when used in etching at high temperature as well as when used in etching at high temperature after storage at room temperature.

One or more embodiments may provide an etching composition for silicon nitride layers, which can significantly increase silicon nitride layer-to-silicon oxide layer etching selectivity when used in etching at high temperature.

One or more embodiments may provide an etching composition for silicon nitride layers, which can retain high silicon nitride layer-to-silicon oxide layer etching selectivity even when used in etching at high temperature after storage at ambient temperature.

One or more embodiments may provide an etching composition for silicon nitride layers, which may eliminate the need for additional equipment and costs for maintaining high temperatures during storage or transportation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An etching composition for a silicon nitride layer, the etching composition comprising:
    about 60 wt % to about 95 wt % of an inorganic acid or a salt thereof, based on a total weight of the etching composition;
    a solvent;
    an acid-modified silica or an acid-modified silicic acid; and
    a cyclic compound containing four or more nitrogen atoms.

2. The etching composition as claimed in claim 1, wherein the cyclic compound containing four or more nitrogen atoms includes a substituted or unsubstituted tetrazole or a substituted or unsubstituted tetrazine.

3. The etching composition as claimed in claim 2, wherein:
    the cyclic compound containing four or more nitrogen atoms includes the substituted or unsubstituted tetrazole,
    the substituted or unsubstituted tetrazole includes a compound represented by Formula 1:

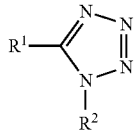

in Formula 1, $R^1$ and $R^2$ are each independently hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

4. The etching composition as claimed in claim 2, wherein:
    the cyclic compound containing four or more nitrogen atoms includes the substituted or unsubstituted tetrazole,
    the substituted or unsubstituted tetrazole includes an aminotetrazole, an alkyltetrazole, or an aminoalkyltetrazole.

5. The etching composition as claimed in claim 1, wherein the inorganic acid includes phosphoric acid.

6. The etching composition as claimed in claim 1, wherein the etching composition includes:
    the about 60 wt % to about 95 wt % of the inorganic acid or the salt thereof;
    about 0.0001 wt % to about 10 wt % of the acid-modified silica or the acid-modified silicic acid;
    about 0.0000001 wt % to about 10 wt % of the cyclic compound containing four or more nitrogen atoms; and
    the solvent,
    all wt % being based on a total weight of the etching composition.

7. A method of etching a silicon nitride layer, the method comprising etching a silicon nitride layer using the etching composition for a silicon nitride layer as claimed in claim 1.

8. The method as claimed in claim 7, wherein the cyclic compound containing four or more nitrogen atoms includes a substituted or unsubstituted tetrazole or a substituted or unsubstituted tetrazine.

9. The method as claimed in claim 8, wherein:
    the cyclic compound containing four or more nitrogen atoms includes the substituted or unsubstituted tetrazole,
    the substituted or unsubstituted tetrazole includes a compound represented by Formula 1:

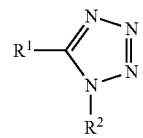

in Formula 1, $R^1$ and $R^2$ are each independently hydrogen; a substituted or unsubstituted $C_1$ to $C_{10}$ alkyl group; a substituted or unsubstituted $C_6$ to $C_{10}$ aryl group; a substituted or unsubstituted $C_7$ to $C_{20}$ arylalkyl group; a halogen; or an amino group.

10. The etching composition according to claim 8, wherein:
    the cyclic compound containing four or more nitrogen atoms includes the substituted or unsubstituted tetrazole,
    the substituted or unsubstituted tetrazole includes an aminotetrazole, an alkyltetrazole, or an aminoalkyltetrazole.

11. The method as claimed in claim 7, wherein the inorganic acid includes phosphoric acid.

12. The method as claimed in claim 7, wherein the etching composition includes:
    the about 60 wt % to about 95 wt % of the inorganic acid or the salt thereof;
    about 0.0001 wt % to about 10 wt % of the acid-modified silica or the acid-modified silicic acid;
    about 0.0000001 wt % to about 10 wt % of the cyclic compound containing four or more nitrogen atoms; and
    the solvent,
    all wt % being based on a total weight of the etching composition.

* * * * *